(12) United States Patent
Eckert et al.

(10) Patent No.: US 7,795,135 B2
(45) Date of Patent: Sep. 14, 2010

(54) METHOD FOR PRODUCING A LAYER ARRANGEMENT

(75) Inventors: Stefan Eckert, Dresden (DE); Klaus Goller, Dresden (DE); Hermann Wendt, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 666 days.

(21) Appl. No.: 11/639,393

(22) Filed: Dec. 14, 2006

(65) Prior Publication Data

US 2008/0102625 A1  May 1, 2008

Related U.S. Application Data

(63) Continuation-in-part of application No. PCT/DE2005/001067, filed on Jun. 15, 2005.

(30) Foreign Application Priority Data

Jun. 18, 2004 (DE) .................. 10 2004 029 519

(51) Int. Cl.
*H01L 21/311* (2006.01)
(52) U.S. Cl. ............... 438/637; 438/672; 257/E21.577; 257/E21.589; 257/E23.16
(58) Field of Classification Search ................ 438/637, 438/672, FOR. 355; 257/E21.577, E21.589, 257/E23.16
See application file for complete search history.

(56) References Cited

U.S. PATENT DOCUMENTS

| 4,943,539 | A | * | 7/1990 | Wilson et al. ............... 438/629 |
| 5,451,543 | A | * | 9/1995 | Woo et al. .................... 438/637 |
| 5,686,356 | A | * | 11/1997 | Jain et al. .................... 438/624 |
| 5,700,737 | A | | 12/1997 | Yu et al. |
| 5,874,357 | A | * | 2/1999 | Jun et al. ..................... 438/638 |
| 5,920,793 | A | * | 7/1999 | Mizushima .................. 438/637 |
| 6,015,751 | A | * | 1/2000 | Liu ............................. 438/637 |
| 6,064,119 | A | | 5/2000 | Jun et al. |
| 6,462,395 | B1 | | 10/2002 | Fukuda et al. |
| 6,750,140 | B2 | * | 6/2004 | Hohnsdorf .................. 438/637 |
| 7,176,571 | B2 | * | 2/2007 | Cheng et al. ................ 257/750 |
| 7,232,762 | B2 | * | 6/2007 | Chang et al. ................ 438/694 |
| 7,259,083 | B2 | * | 8/2007 | Menon et al. ............... 438/586 |

(Continued)

FOREIGN PATENT DOCUMENTS

DE   101 40 468 A1   3/2003

(Continued)

OTHER PUBLICATIONS

English language version of Chinese Office Action.

(Continued)

*Primary Examiner*—George Fourson
(74) *Attorney, Agent, or Firm*—Brinks Hofer Gilson & Lione

(57) ABSTRACT

The invention relates to a method for producing a layer arrangement. An electrically conductive layer is formed and patterned. A sacrificial layer formed on at least part of the patterned electrically conductive layer. An electrically insulating layer is formed on the electrically conductive and sacrificial layers and is patterned in such a manner that one or more surface areas of the sacrificial layer are exposed. The exposed areas of the sacrificial layer are removed to expose one or more surface areas of the patterned electrically conductive layer. The patterned electrically conductive layer is covered with a pattern of electrically conductive material.

19 Claims, 13 Drawing Sheets

U.S. PATENT DOCUMENTS

| | | |
|---|---|---|
| 2003/0036227 A1 | 2/2003 | Hohnsdorf |
| 2003/0148603 A1* | 8/2003 | Gardner ............... 438/637 |
| 2003/0201121 A1 | 10/2003 | Jeng |
| 2004/0048203 A1* | 3/2004 | Furusawa et al. ........... 430/314 |
| 2008/0073724 A1* | 3/2008 | Liang et al. ............. 257/369 |
| 2008/0102625 A1* | 5/2008 | Eckert et al. .............. 438/643 |

FOREIGN PATENT DOCUMENTS

| | | |
|---|---|---|
| JP | 04-259241 A | 9/1992 |
| JP | 05-190688 A | 7/1993 |
| JP | 09-129732 A | 5/1997 |
| JP | 09-191051 A | 7/1997 |
| JP | 10-303299 A | 11/1998 |
| JP | 2000-235973 A | 8/2000 |
| JP | 2001-127151 A | 5/2001 |
| JP | 2004-079805 A | 3/2004 |

OTHER PUBLICATIONS

English translation of a foreign Office Action issued in a related case.
International Preliminary Report (in the German language) [dated Dec. 20, 2006].
English language version of the International Preliminary Report [dated Dec. 28, 2006].
Japanese Office Action, with English translation, dated Oct. 27, 2009 (12 pgs.).

* cited by examiner

Prior Art
FIG 1A   FIG 1B   FIG 1C
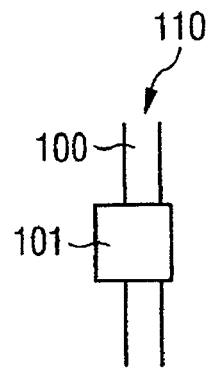
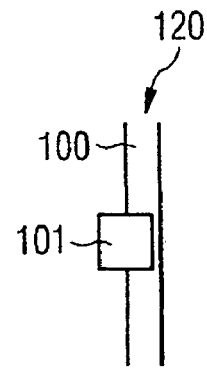
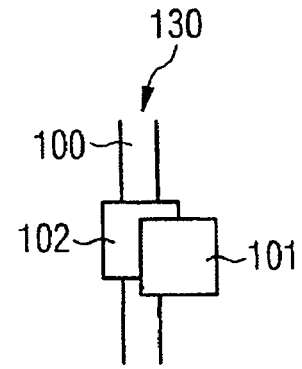
Prior Art
FIG 2A
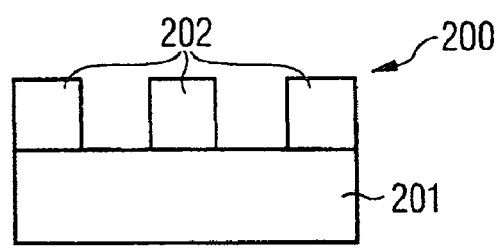
FIG 2B
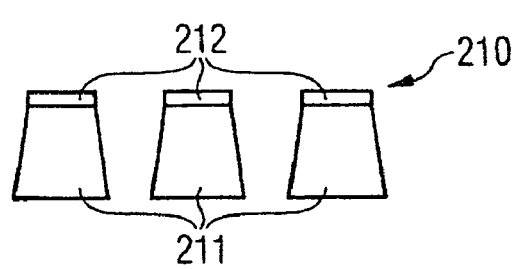
FIG 2C
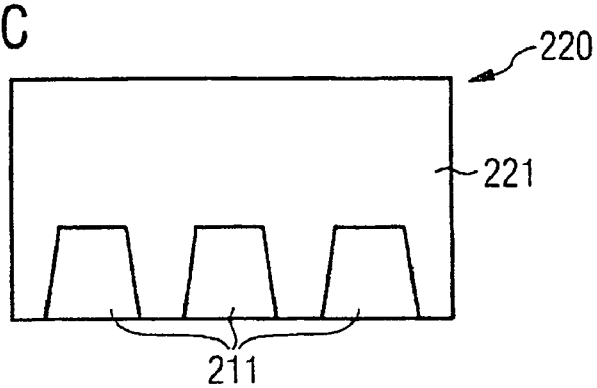

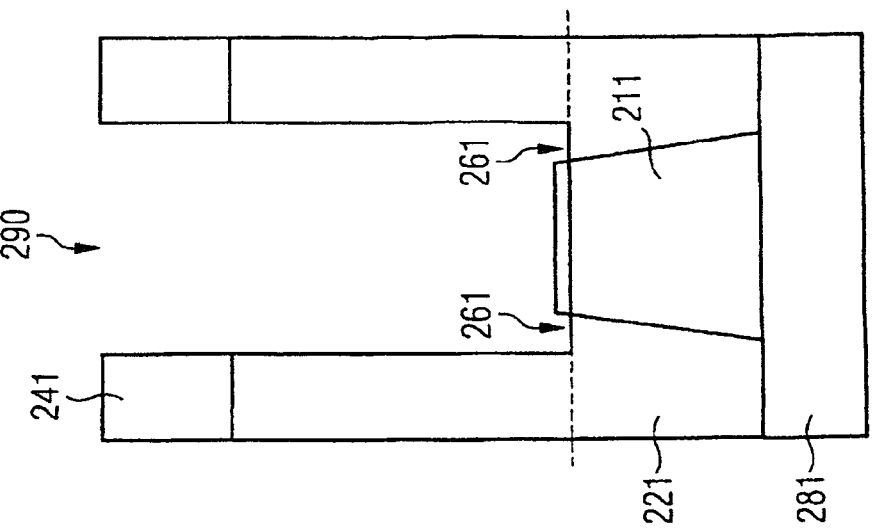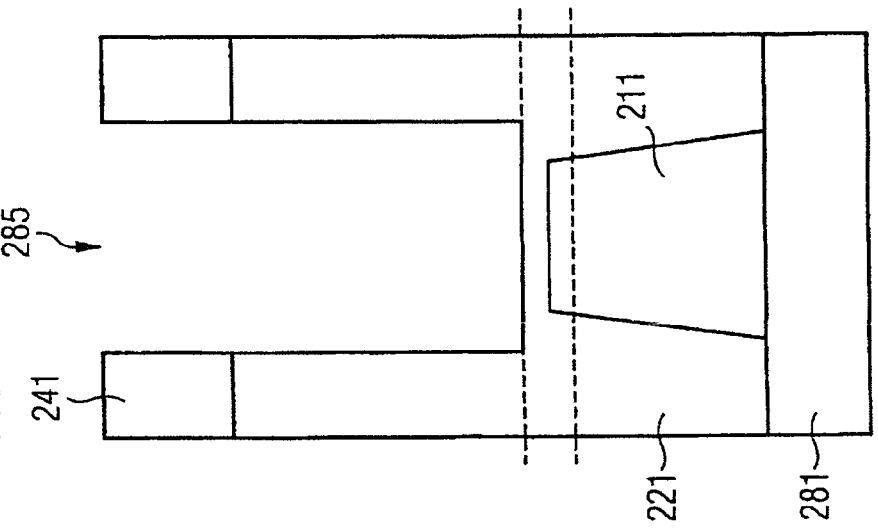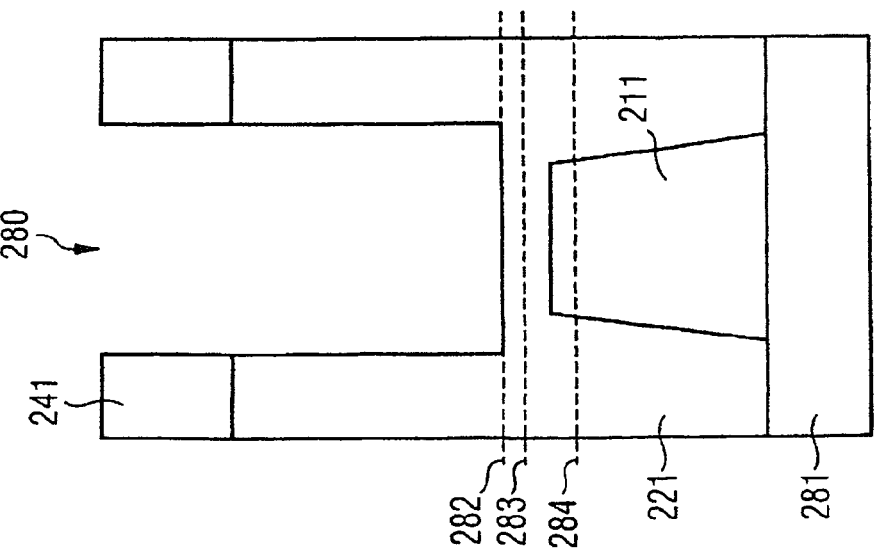

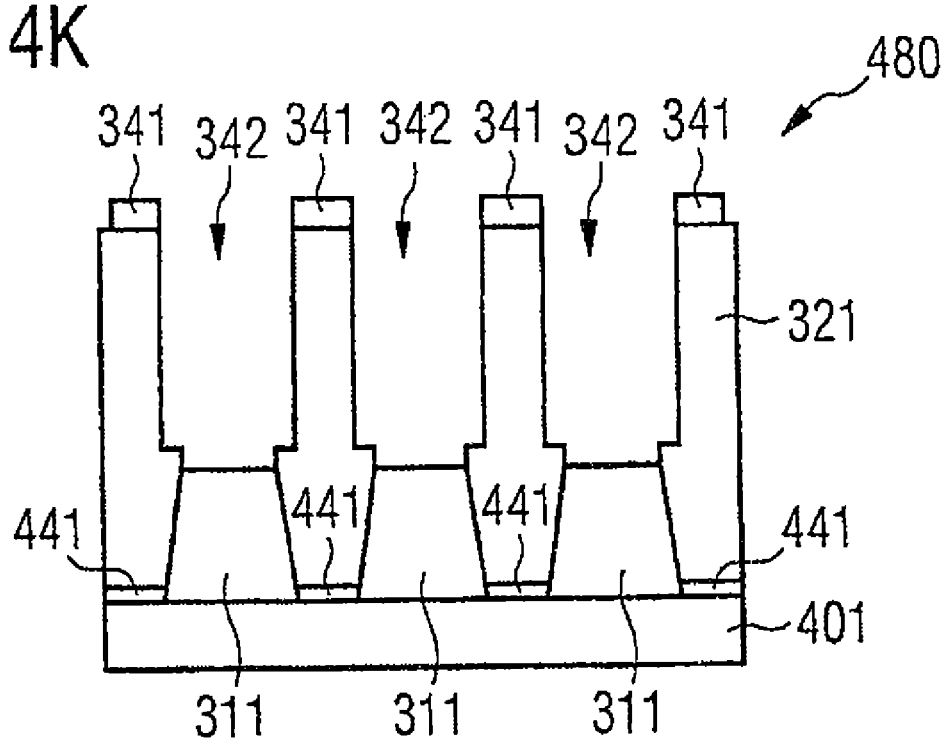
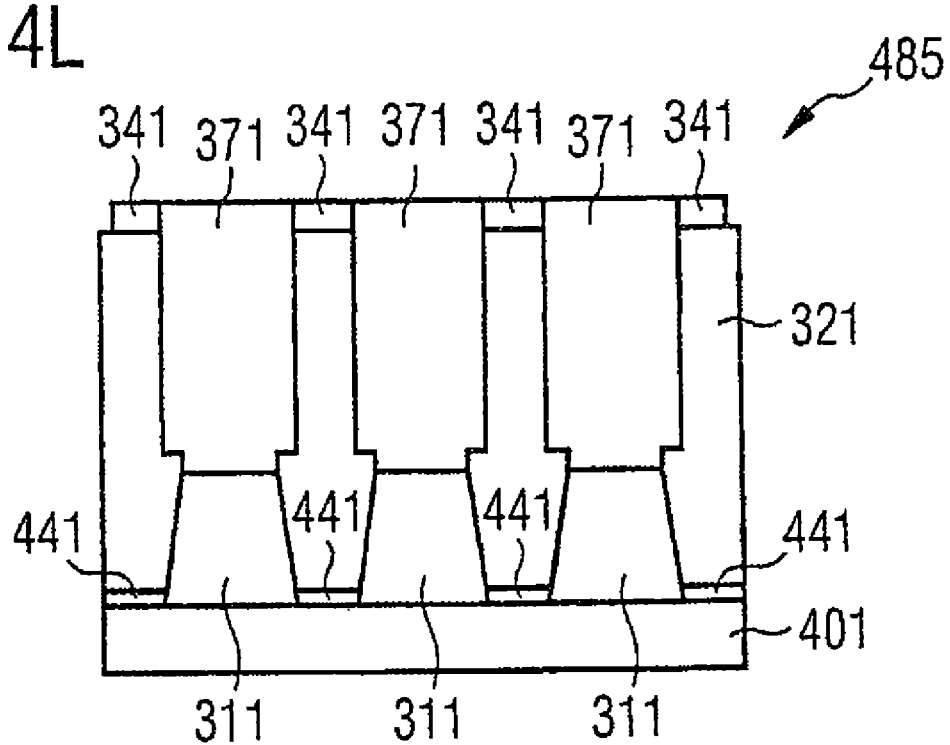

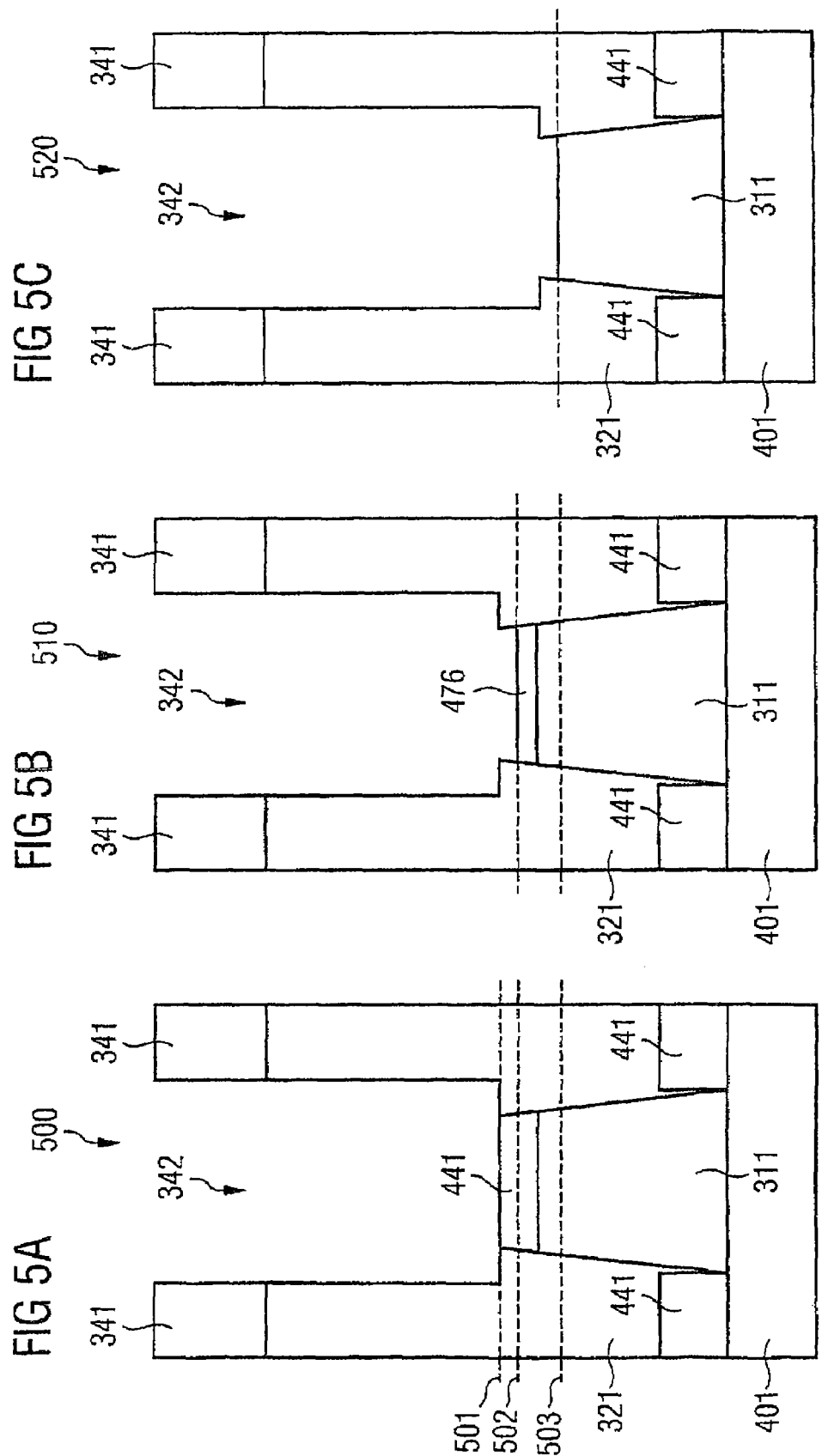

METHOD FOR PRODUCING A LAYER ARRANGEMENT

PRIORITY CLAIM

This application is a continuation-in-part application of international application number PCT/DE2005/001067, filed on Jun. 15, 2005, which claims the benefit of priority to German Patent Application DE 10 2004 029 519.0, filed Jun. 18, 2004, which are incorporated herein by reference.

TECHNICAL FIELD

The invention relates to a method for manufacturing a layer arrangement.

BACKGROUND INFORMATION

In integrated circuits, a vertical electrical contact is established between conductor tracks of different metallization levels by using so-called vias. Vias, i.e. trenches orientated vertically with respect to a substrate surface, are frequently created by using a lithography and a plasma etching method and can then be filled with electrically conductive material. Between the material of a conductor track of a metallization level to be contacted, and the material of a via, an adhesive, barrier or seed layer (liner layer) can be provided by means of which a contact can be established between the two materials to be coupled or an unwanted diffusion of material of the via filling into that of the conductor track (or vice versa) can be prevented.

Due to process-related fluctuations in the adjustment of etching masks for vias, however, these cannot be patterned optimally but only with a certain, for example lateral offset. Such an offset lies within the limits specified in design rules for designing an integrated circuit, but cannot be precisely determined for an individual via. Such fluctuations are taken into consideration in the design rules for designing the integrated circuit by means of rules which, for example, define greater than nominally required contact areas for vias in order to ensure later contact between conductor track and the via filled with electrically conductive material.

Apart from the area of the via itself, the layout takes into consideration larger metal areas on which the vias land, including the adjustment error described. This is not a weakness of the process but is necessitated by the processing. For all production steps, a tolerance range must be defined within which a physical quantity has to lie in order to be able to correctly deliver the microelectronic component to be produced.

The larger areas are called "landing pads" for vias and must be taken into consideration in the design rules for forming an integrated circuit. For example, a via bottom can have a diameter of 200 nm. Such a via must be positioned, for example, on an area of 240 nm×240 nm (edge length). In this case, a maximum offset of 20 nm per edge would be permissible.

The larger areas lead to a lateral winding of the metal tracks in the environment of the vias which interrupts the routing in the design. This is disadvantageous with regard to the high costs of chip area since it increases the space required for an integrated circuit. Metal tracks themselves can be processed at a small distance from one another but the vias require widening of the metal track for forming the landing pads. This additional expenditure in the layout and the associated loss in chip area is disadvantageous with regard to the requirement for ICs with increasingly greater integration.

As the dimensions of ICs and their components such as conductor tracks shrink further, as has to be expected, the cases shown, in particular, in FIG. 1A to FIG. 1C, can occur.

FIG. 1A shows a layout top view 110 with a conductor track 100 which is to be contacted by means of a via 101. The diameter of the via 101 is greater than the width of the conductor 100 so that, in the case of a process-related lateral offset between the centroids of the conductor track 100 and the via 101, contacting of the conductor track 100 by the via 101 must still be guaranteed.

In a second layout top view 120, which is shown in FIG. 1B, the diameter of a via 101 and of a conductor track 100 are of the same size but, due to an edge position error in the via exposure, the via 101 is partially arranged adjacently to the conductor track 100 which can lead to a poorer electrical contacting.

In a third layout top view 130 shown in FIG. 1C, a conductor track 100 and a via 101 is again shown where the via 101, in spite of local track widening in form of a landing pad 102, comes to lie adjacently to the conductor track 100 due to the adjustment tolerance of the phototechnology during the formation of the via 101.

In the further text, a method for manufacturing a layer arrangement according to the prior art, by means of which an integrated circuit according to the first layout top view 110 from FIG. 1A can be formed, referring to FIG. 2A to FIG. 2H.

To obtain the layer sequence 200 shown in FIG. 2A, an aluminum layer 201 is applied to a substrate (not shown) and, depending on the intended fineness of pattern, an additional ARC (antireflective coating) layer. On the aluminum layer 201, photoresist material is subsequently formed which is patterned to form a photoresist mask 202, using a lithography method and an etching method.

To obtain the layer sequence 210 shown in FIG. 2B, the aluminum layer 201, starting with the layer sequence 200 shown in FIG. 2A and using the photoresist mask 202, is patterned in such a way that aluminum conductor tracks 211 are formed. Depending on the intended fineness of pattern, a hard-surface mask can be used for patterning the aluminum conductor tracks 211. The photoresist 202 is then removed already after the pattern has been transferred into the hard-surface mask. The hard-surface mask then replaces the photoresist mask 202. On each of the aluminum conductor tracks 211, a photoresist residue 212 remaining after the etching is shown which is subsequently removed by means of a stripping method.

To obtain the layer sequence 220 shown in FIG. 2C, starting from the layer sequence 210 shown in FIG. 2B and after removal of the photoresist residue 212, a silicon oxide layer 221 is deposited which covers the aluminum conductor tracks 211.

To obtain the layer sequence 230 shown in FIG. 2D, photoresist material is deposited on the layer sequence 220 and patterned, by using a lithography method and an etching method, to form a photoresist mask 231.

To obtain the layer sequence 240 shown in FIG. 2E, the layer sequence 230, using the photoresist mask 231 as etching mask, is subjected to an etching method as a result of which material of the silicon oxide layer 221 is removed and trenches 242 are formed. Residue photoresist areas 241 remain on the surface of the layer sequence 240.

The layer sequence 250 shown in FIG. 2F is obtained when, starting from the layer sequence 240, the method for etching the silicon oxide layer 221 is continued. At a certain process time during this etching method, the depth of the trenches 242 is such that surface areas of the aluminum conductor tracks 211 are exposed. The layer sequence 250 according to this process state is shown in FIG. 2F where the via etching has already arrived on the patterned metal track 211.

To obtain the layer sequence 260 shown in FIG. 2G, the etching method described with reference to FIG. 2E and FIG. 2F is continued. Due to process-related differences in thickness, frequently occurring in practice, of the patterned silicon oxide layer (as interlayer dielectric, ILD) above a wafer as substrate, overetching is required, i.e. deeper etching than to the surface areas of the conductor tracks 221. This overetching is performed so that the vias can later can be reliably connected to conductor tracks 211 on the wafer. The duration of overetching is typically 10% to 30% of the entire via etching time. The result of the overetching process is shown in layer sequence 260. Although the surface areas of the conductor tracks 211 are reliably exposed, enabling contacting with via material in a subsequent process step, narrow gaps 261 form in the boundary areas between material of the silicon oxide layer 221 and the exposed sections of the conductor tracks 211 due to the overetching, as shown in FIG. 2G.

As a result of the overetching, the etching thus bypasses the metal tracks 211 on both sides and creates narrow gaps 261. The depth of the gaps 261 and thus their aspect ratio depend on the local thickness of the dielectric layer 211 and can vary across the wafer. These narrow gaps 261 are the cause of many problems which lead to severe reliability problems. Thus, polymer material in the gaps 261 can only be cleaned or removed incompletely or not at all. This leads to problems in a subsequent liner deposition and/or metal filling for forming the vias. Furthermore, adhesive, seed or barrier layers, called liners, can only be deposited incompletely when narrow gaps 261 occur. Since, as a rule, such a depositing occurs by using also physical processes, the locally existing aspect ratio of the narrow gaps 261 plays an important role. The higher the aspect ratio, the smaller the edge covering with the respective layer. During the metal filling, cavities can thus arise in the area of the narrow gaps 261 or individual vias are not filled at all or only badly. This leads to unreliable contacting between metal tracks 211 and vias.

To obtain the layer arrangement 270 according to the prior art, shown in FIG. 2H, the trenches 242 from FIG. 2G are filled with tungsten material for forming tungsten vias 271. As described above, the narrow gaps 261 with locally greatly increased aspect ratio, formed due to the overetching, cannot be filled up reliably. This leads to problems with regard to the quality of the layer arrangement 270 with regard to its use as integrated circuit.

In the further text, it is again described, referring to FIG. 2I to FIG. 2K, what processes lead to the formation of the unwanted narrow gaps 261 when the process for producing a layer arrangement according to FIG. 2A to FIG. 2H is carried out.

The layer sequence 280 shown in FIG. 2I shows a state during the etching of the silicon oxide layer 221 in which the etch front has reached a first level 282.

As shown in FIG. 2J, a layer sequence 285 is obtained when, starting from the layer sequence 280, the etching process for etching the first silicon oxide layer 221 is continued. The etch front then extends up to a second level 283.

Since a certain overetching is required for ensuring that all surfaces of all aluminum conductor tracks 211 are exposed is technologically required, the case shown in FIG. 2K in which the etch front has penetrated to a third level 284 in a layer sequence 290 occurs according to the prior art, so that unwanted narrow gaps 261 occur at lateral areas of the exposed aluminum conductor track 211.

For the cases shown in FIG. 1B and FIG. 1C, a similar picture is obtained as for FIG. 1A. There is always deep etching-in next to the metal track which then leads to the problems described above.

SUMMARY

The invention is based, in particular, on the object of providing a method for producing a layer arrangement providing for improved contacting between different electrically conductive patterns.

The object is achieved by a method for producing a layer arrangement having the features according to the independent patent claim.

In the method according to the invention for manufacturing a layer arrangement, an electrically conductive layer is formed on a substrate and patterned and following this a sacrificial layer is formed on at least a part of the electrically conductive layer. An electrically insulating layer is formed on the electrically conductive layer and on the sacrificial layer. The electrically insulating layer is patterned in such a manner that surface areas of the sacrificial layer are exposed. The exposed areas of the sacrificial layer are removed as a result of which surface areas of the electrically conductive layer are exposed. Finally, the exposed surface areas of the patterned electrically conductive layer are covered with a pattern of electrically conductive material.

A basic concept of the invention can be seen in the fact that, between an electrically conductive layer which, in a patterned state, can form, e.g. conductor tracks of an integrated circuit, and an electrically insulating layer deposited thereon as intermetal dielectric, a sacrificial layer with characteristics which are freely selectable for its functionality, is provided by means of which overetching for exposing surface areas of the patterned electrically conductive layer for contacting the latter with a pattern of electrically conductive material (e.g. vias) can be shortened or prevented altogether.

To illustrate, the sacrificial layer has the function that it can be used for synchronizing the etching processes for exposing the individual areas of the patterned electrically conductive layer in time/space. During etching of the electrically insulating layer according to the prior art, the problem occurs that the thickness of the electrically insulating layer is frequently relatively large and different for different individual areas of the patterned electrically conductive layer which, for reliably exposing all individual areas, requires an extended etching time which can lead to formation of unwanted narrow gaps in some of the individual areas (see FIG. 2E to FIG. 2H). According to the invention, this problem is prevented by providing the sacrificial layer since, when the sacrificial layer is used as etch stop layer and/or as sufficiently quickly etchable layer, due to the different materials and thus etching rates of the electrically insulating layer, on the one hand, and of the sacrificial layer, on the other hand, the etch front can first penetrate to the sacrificial layer above all individual areas. Once the etch front has reached the sacrificial layer on the individual areas of the patterned electrically conductive layer, the sacrificial layer is removed on all individual areas of the patterned electrically conductive layer by means of an additional etching process. It is advantageous here that the sacrificial layer is set up with regard to choice of material and/or thickness and/or etching properties, in such a manner that during the etching of the sacrificial layer, the etch front reaches all individual areas of the patterned electrically conductive layer approximately at the same time so that overetching and a resultant formation of unwanted narrow gaps is prevented. This can be achieved, in particular, when the etching rate for removing the sacrificial layer is adjusted to be greater, with respect to predeterminable etching parameters of the etching process used, than for the electrically insulating layer and/or when the thickness of the sacrificial layer is provided to be sufficiently small and/or uniform. The duration of the etching of the sacrificial layer is then kept short. This etching can start essentially at the same time in all individual areas of the sacrificial layer, i.e. the sacrificial layer can be used as stop layer, to illustrate.

This very simple method using the sacrificial layer ensures in several components of the patterned electrically conductive layer (e.g. a number of conductor tracks) that, even with locally different layer thickness of the electrically insulating layer, initially, in the case of all components of the patterned electrically conductive layer, the electrically insulating material formed above it is removed to the surface of the sacrificial layer. Thus, a quite particular intermediate processing state can be defined due to the provision of the sacrificial layer, in which the etch front has reached all surface areas of the sacrificial layer. The sacrificial layer can be provided, for example, to be particularly thin or from a material with a particularly high etching rate so that, after the sacrificial layer is reached, rapid removal of the stop layer is made possible at all components of the patterned electrically conductive layer. Due to the rapid removability of the stop layer due to its small thickness and due to its etchability with a high etching rate, the overetching which was required for quality assurance according to the prior art, can be considerably shortened or prevented completely.

In other words, the etching of the electrically insulating layer and of the sacrificial layer for forming trenches (which are provided for later filling with material of a pattern of electrically conductive material, e.g. as vias) occurs laterally self adjusted so that problems with narrow gaps due to a long overetching time, occurring in the prior art, are prevented.

A basic concept of the invention is based on the material of the sacrificial layer which can be provided optimized and which can be selected in such a manner that the sacrificial layer can be used as stop layer during the etching and can then be removed particularly quickly and without great overetching. An important aspect of the invention can thus be seen in the use and combination of different etching processes and different materials wherein the process can be optimized by choosing suitable etching parameters.

Thus, a suitable supplementary or sacrificial layer exists on the material of the patterned electrically conductive layer to be contacted, which is patterned together with the metal etching for patterning the electrically conductive layer. The parameters of the etching for exposing surface areas of the patterned electrically conductive layer (e.g. via etching) can be adjusted in such a manner that the sacrificial or supplementary layer is etched much quicker than the surrounding material of the electrically insulating layer (interlayer dielectric). Starting from a state in which the via etch front has just reached the supplementary layer, the supplementary layer is etched more quickly in the further course of the etching so that the etch front stays back in the electrically insulating layer. Once the etch front has reached the material of the patterned electrically conductive layer to be contacted, a short overetching process can be optionally performed so that the etching step present in the dielectric layer is pulled down. In advantageous cases, the etch front then finishes together with the metal surface, or is slightly higher, after the overetching. Even in disadvantageous cases in which etching occurs below the metal level in the overetching process, the formation of unwanted narrow gaps is distinctly reduced in every case compared with the prior art so that the problems in deposition of a liner material or the filling of the vias, which problems are based on the presence of narrow gaps with locally increased aspect ratio, are distinctly reduced.

When using the sacrificial layer according to the invention, there are, in particular, two different scenarios: the sacrificial layer can be used as etch stop layer and/or as rapidly etchable layer.

When using the sacrificial layer as etch stop layer, material of the electrically insulating layer located above the patterned electrically conductive layer and above the sacrificial layer is first removed, the removal of material of the etching process ending when the sacrificial layer is reached. In the case of an (unwanted but not always completely avoidable) lateral offset of the etching mask, i.e. when the etch front is slightly offset laterally compared with the individual patterns of the sacrificial layer, it may occur that material of the electrically insulating layer which is arranged laterally below the surface of the sacrificial layer and is located adjacently to the sacrificial layer is removed. In this scenario, it is advantageous if the thickness of the sacrificial layer is selected to be at least as large as a thickness range (i.e. a range of thickness variation) of the electrically insulating layer since then no unwanted narrow gap created with such a lateral offset. This is because, if the etch front reaches the sacrificial layer at the thickest place of the electrically insulating layer, it has not yet completely passed the sacrificial layer at the thinnest place of the electrically insulating layer (see FIG. 6A, FIG. 6B).

When the sacrificial layer is used as rapidly etchable layer, the sacrificial layer can be provided as a layer which has a much higher etching rate compared with the electrically insulating layer. In this scenario, too, it is advantageous if, particularly in the case of an (unwanted but not always completely avoidable) lateral offset of the etching mask, i.e. when the etch front is laterally slightly offset compared with the individual patterns of the sacrificial layer, the thickness of the sacrificial layer is selected to be at least as large as a thickness range (i.e. a range of thickness variation) of the electrically insulating layer since then no unwanted narrow gap is created with such a lateral offset (see FIG. 7A to FIG. 7C).

Preferred embodiments of the invention are obtained from the dependent claims.

According to a first preferred embodiment of the method for producing a layer arrangement, the electrically conductive layer is first formed and the sacrificial layer is formed on the electrically conductive layer. Following this, the electrically conductive layer and the sacrificial layer are jointly patterned. To illustrate, according to this embodiment, the electrically conductive layer, and on its exposed surface the sacrificial layer, is first formed flatly. After that, the two layers arranged above one another are jointly subjected to a lithography process and an etching process so that the patterned electrically conductive areas are covered with material of the sacrificial layer with a few process steps.

According to a second preferred embodiment of the method, the electrically conductive layer is first formed and patterned. Following this, the sacrificial layer is formed on the electrically conductive layer. In this case, material of the sacrificial layer can also be formed between adjacent areas of the patterned electrically conductive layer which does not present a problem for the further course of the processing. In the processing described, the side walls of the patterned areas of the electrically conductive layer can remain free of material of the sacrificial layer.

In the method according to the invention, the sacrificial layer can be used as stop layer. According to this embodiment, the etch front, during the etching of the electrically insulating layer, is prevented from removing the sacrificial layer when it reaches the surface of the sacrificial layer since the latter is prevented from being etched with respect to the etching parameters for etching the electrically insulating layer (e.g. etchant composition). As a result, when the etching is continued with the etching parameters for etching the electrically insulating layer, the etch front reliably reaches all surface areas of the patterned sacrificial layer without initially removing it, i.e. the sacrificial layer surface stops this etching process. After modification of the etching parameters (e.g. changing the etchant composition), the removal of all wanted areas of the patterned sacrificial layer then begins simultaneously.

The sacrificial layer can be removed at a higher rate than the electrically insulating layer. This embodiment enables the sacrificial layer to be removed at a higher etching rate, i.e. a higher removal of material per unit time, than the electrically insulating layer. If, e.g., the electrically insulating layer is provided with silicon oxide material and the sacrificial layer is provided with silicon nitride or silicon oxynitride material, the silicon nitride sacrificial layer will be etched much more quickly than the electrically insulating silicon oxide layer when using etching in which hydrogen, oxygen or carbon monoxide material is added as etchant or its concentration is increased. To illustrate, the etching rate of silicon oxide can be progressively reduced when increasing, for example, the oxygen concentration when etching which does not take place in a silicon nitride layer or only to a much lesser extent. As a result, the etching rate of the different layers can be adjusted accurately, and the formation of narrow gaps reduced greatly, by selecting the material combination of electrically insulating layer and sacrificial layer and the etching parameters, respectively. According to the invention, defective electrical contacting between conductor tracks and vias due to poor filling of narrow gaps with local high aspect ratio is thus prevented. Unwanted cavities in the layer arrangement, quality problems and poor electrical contacting are prevented in the layer arrangement according to the invention.

The sacrificial layer and the electrically insulating layer are preferably removed by using an etching process which is set up in such a way that the sacrificial layer is removed at a higher etching rate than the electrically insulating layer.

Tetrafluoromethane ($CF_4$), trifluoromethane ($CHF_3$), nitrogen ($N_2$) and/or argon (Ar) can be used as etchant in the etching process.

The etching rate can be adjusted by adjusting the concentration of oxygen ($O_2$), hydrogen ($H_2$) and/or carbon monoxide (CO) in the etchant or by lowering the temperature of the wafer (the nitride etching rate increases at low temperature, the oxide etching rate decreases slightly at higher temperature).

As an alternative or additionally to the provision of the sacrificial layer, on the one hand, and the electrically insulating layer, on the other hand, of material with different etching rates, the sacrificial layer can have a lesser, preferably a much lesser thickness than the electrically insulating layer, preferably less than one half, more preferably less than one fifth, even more preferably less than one tenth of the thickness of the electrically insulating layer. The thinner the sacrificial layer provided, the more quickly the sacrificial layer can be removed which keeps down underetching.

A liner layer can be formed between the electrically conductive layer and the pattern of electrically conductive material. Such a liner layer, a seed, adhesive or barrier layer, is used for producing a good mechanical and electrical contact between the patterned electrically conductive layer (e.g. of aluminum) and the pattern of electrically conductive material (for example of tungsten). Using a liner layer thus makes it possible to prevent material of the patterned electrically conductive layer from diffusing into material of the pattern of electrically conductive material or vice versa.

The liner layer can be formed after the exposure of the surface areas of the patterned electrically conductive layer. To illustrate, according to this embodiment, the surface of a trench of the layer arrangement which is formed after the exposure of the surface areas of the patterned electrically conductive layer can be covered with the liner material of a small thickness of typically 45 nm. As an alternative, the liner layer can be created between the formation of the electrically conductive layer and the formation of the sacrificial layer so that the electrically conductive layer is already covered with the liner layer after the sacrificial layer has been removed.

The joint patterning of the electrically conductive layer and of the sacrificial layer and/or the patterning of the electrically insulating layer can be carried out by using a lithography process and an etching process.

The electrically conductive layer and/or the sacrificial layer can be formed by using a conformal deposition process, e.g. by means of a CVD (chemical vapor deposition) process or an ALD (atomic layer deposition) process. The atomic layer deposition process makes it possible to generate a layer with a very precisely predeterminable thickness which can be deposited in very homogeneous thickness on a surface with an accuracy of up to one atom layer (i.e. to an accuracy of a few Angstrom). Forming a sacrificial layer with uniform, precisely predeterminable thickness has the advantage that it can be removed within a spatially constant time.

The layer arrangement can be formed as integrated circuit. The layer arrangement can be formed on and/or in a semiconductor material (e.g. silicon wafer or silicon chip). In particular, the layer arrangement can be formed in the metallization level of an integrated circuit (end of the line).

In the method according to the invention, the electrically conductive layer can also be patterned for forming conductor tracks and the pattern of electrically conductive material can be created for forming vias.

The electrically conductive layer and/or the pattern of electrically conductive material can be formed from aluminum and/or tungsten. In particular, aluminum material is a suitable material for the electrically conductive layer as conductor tracks. Tungsten material is a good choice for the pattern of electrically conductive material when used as vias.

The sacrificial layer can be formed from silicon nitride and/or from silicon oxynitride.

The electrically insulating layer can be formed from silicon oxide.

The material combination of a nitrogen-containing sacrificial layer and an electrically insulating layer of silicon oxide is a particularly advantageous combination of materials which, with a suitable etchant, leads to quick etching of the sacrificial layer and slower etching of the electrically insulating layer.

The liner layer can be formed from titanium nitride (TiN).

BRIEF DESCRIPTION OF THE DRAWINGS

An exemplary embodiment of the invention is shown in the figures and will be explained in greater detail in the text which follows.

FIGS. 1A to 1C show layout top views according to the prior art.

FIG. 2A to 2K show layer sequences at different times during a process for manufacturing a layer arrangement according to the prior art.

FIGS. 4A to 4L show layer sequences at different times during a process for manufacturing a layer arrangement according to a second exemplary embodiment of the invention.

FIGS. 5A to 5C show layer sequences at different times during a process for manufacturing a layer arrangement according to the invention.

Identical or similar components in different figures are provided with identical reference numbers.

The representations in the figures are diagrammatic and not to scale.

DETAILED DESCRIPTION

In the further text, a method for producing a layer arrangement according to a first exemplary embodiment of the invention is described with reference to FIG. 3A to FIG. 3H.

Figure 3A:
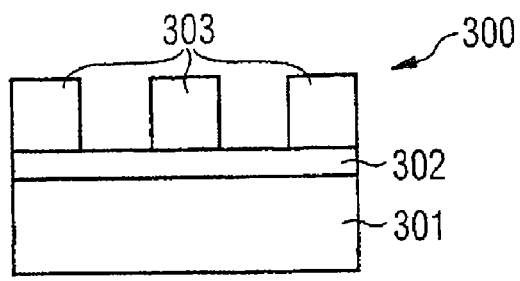
FIGS. 3A to 3H show layer sequences at different times during a process for manufacturing a layer arrangement according to a first exemplary embodiment of the invention.

To obtain the layer sequence 300 shown in FIG. 3A, an aluminum layer 301 is formed on a silicon substrate (not shown) by using a conformal deposition process. On the aluminum layer 301, a silicon nitride sacrificial layer 302 is deposited conformally by using a CVD process. As an alternative, such a sacrificial layer can also be formed of silicon oxynitride material. On the silicon nitride sacrificial layer 302, photoresist material is formed and patterned to form a photoresist mask 303 by using a lithography process and an etching process.

Figure 3B:
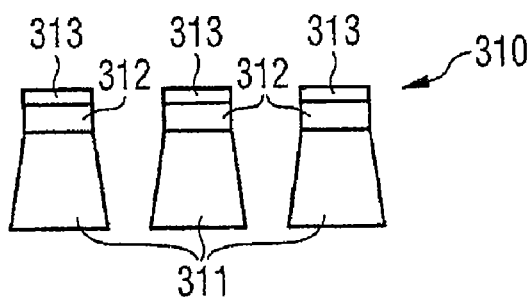

To obtain the layer sequence 310 shown in FIG. 3B, the aluminum layer 301 and the silicon nitride sacrificial layer 302, starting from the layer sequence 300 shown in FIG. 3A, are patterned jointly, i.e. in an associated method step, by using an etching process. As a result, aluminum conductor tracks 311 are formed wherein when on each aluminum conductor track 311, one of a number of sacrificial layer areas 312 is arranged, covered by a photoresist residue 313 which has remained on the surface of the layer sequence 310 after the etching process. Following this, the photoresist residue 313 is removed by using a stripping method.

Figure 3C:
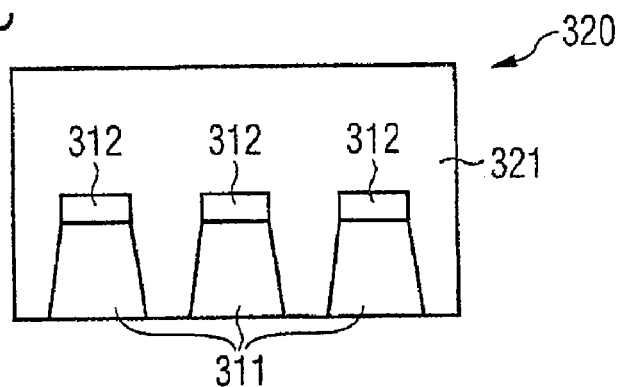

To obtain the layer sequence 320 shown in FIG. 3C, a silicon oxide layer 321 is formed on the layer sequence 310 by using a CVD (chemical vapor deposition) process, after removal of the photoresist residue 313.

Figure 3D:
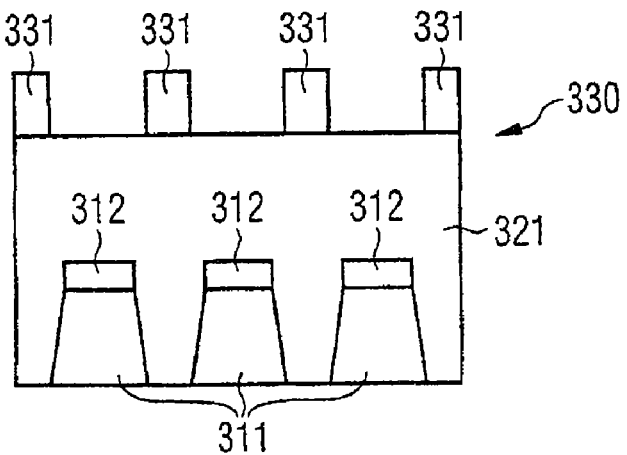

To obtain the layer sequence 330 shown in FIG. 3D, a photoresist layer is formed on the layer sequence 320 and patterned to form a photoresist mask 331 by using a lithography process and an etching process.

Figure 3E:
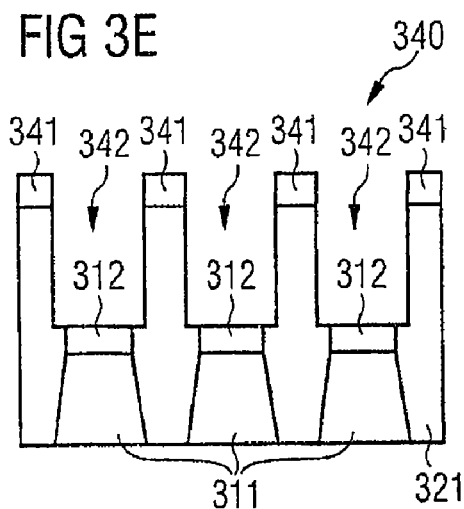

To obtain the layer sequence 340 shown in FIG. 3E, the layer sequence 330 is subjected to such an etching process that material of the silicon oxide layer 321 is removed by using the etching mask 331 until the etch front has reached the surface of the sacrificial layer areas 312. During this process, the sacrificial layer areas 312 are used as stop layer for the etching process. Due to this etching process, trenches 342 are formed in the silicon oxide layer 321 and surface areas of the sacrificial layer areas 312 are exposed. The functionality of the sacrificial layer areas 312 as stop layers ensures that etching in each case only takes place to the surface of the thin sacrificial layer areas 312 even in the case of locally different thickness of the silicon oxide layer 321 in areas of different trenches 342. It must be noted that the use of the sacrificial layer according to the invention as etch stop layer is only one of a number of variants. According to another variant, a particularly high etching rate of the material of the sacrificial layer can be utilized as an alternative or additionally (see, e.g. FIGS. 7A to 7C).

Figure 3F:
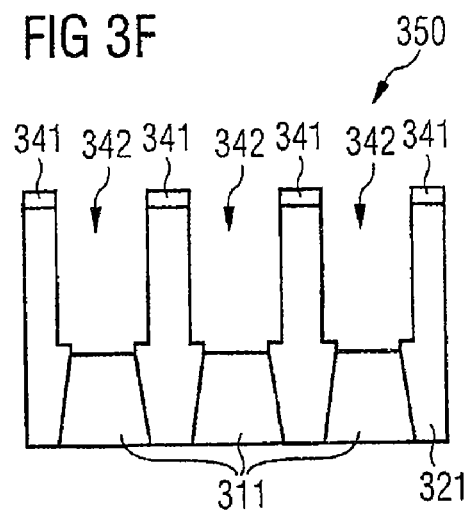

To obtain the layer sequence 350 shown in FIG. 3F, the sacrificial layer areas 312 are removed in all trenches 342 by using another etching process which is set up for etching the material of the sacrificial layer areas 312, as a result of which surface areas of the aluminum conductor track 311 are exposed. The material of the sacrificial layer areas 312 (silicon nitride) has such material properties that the etching process removes this material at a very high etching rate, i.e. very rapidly. The ratio of the etching rates of silicon nitride to silicon oxide can be increased, for example, by adding an oxygen component to the etchant. Furthermore, the thickness of the sacrificial layer areas 312 is selected to be so thin that, in combination with the increased etching rate, a particularly rapid removal of these areas is ensured. This leads to the etch front reaching the surface areas of the different conductor tracks 311 approximately at the same time and after a short processing time which prevents an extended underetching required according to the prior art.

Figure 2D:
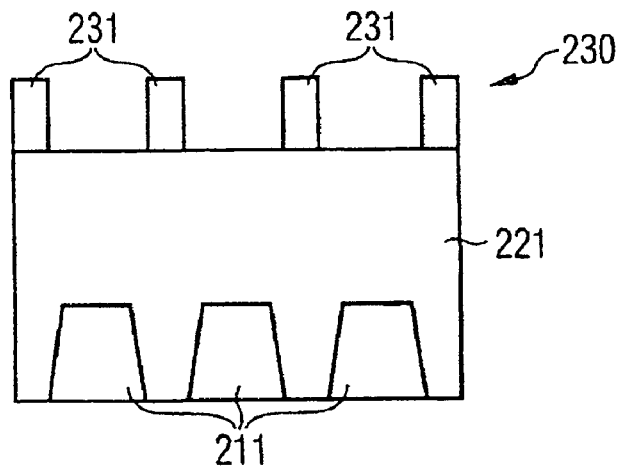
Figure 2E:
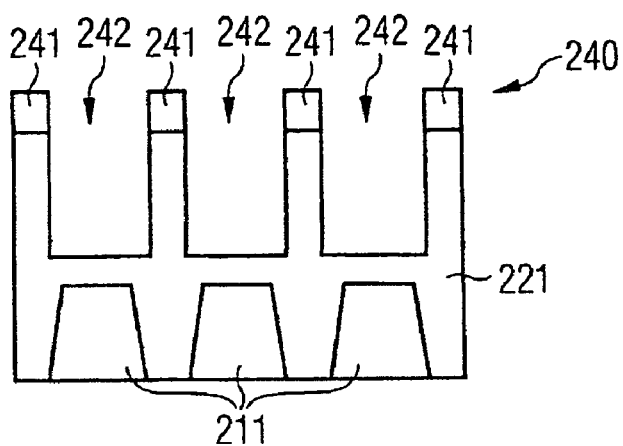
Figure 2F:
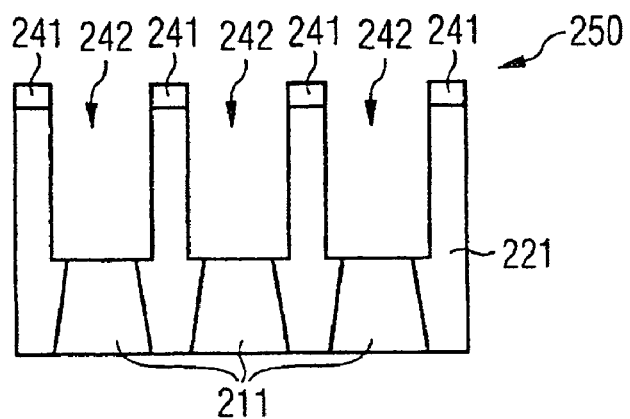
Figure 2G:
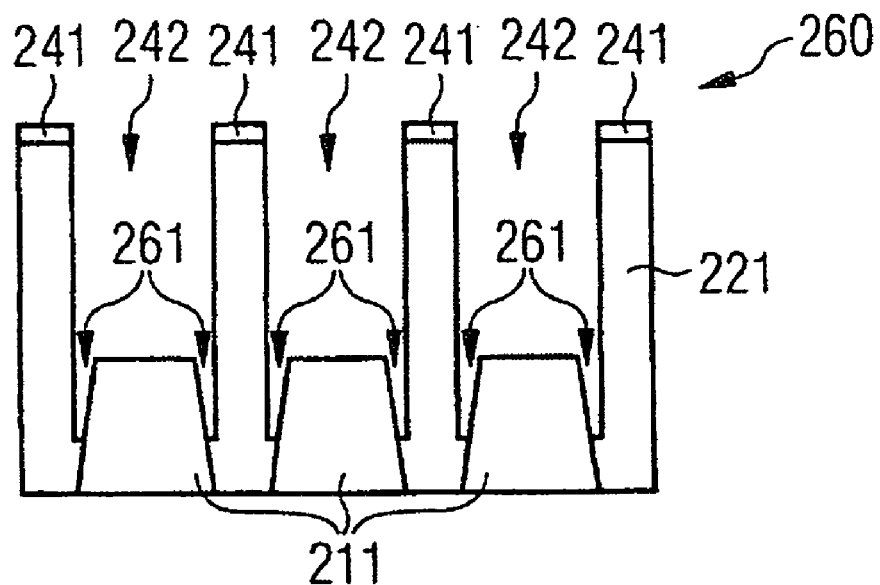
Figure 2H:
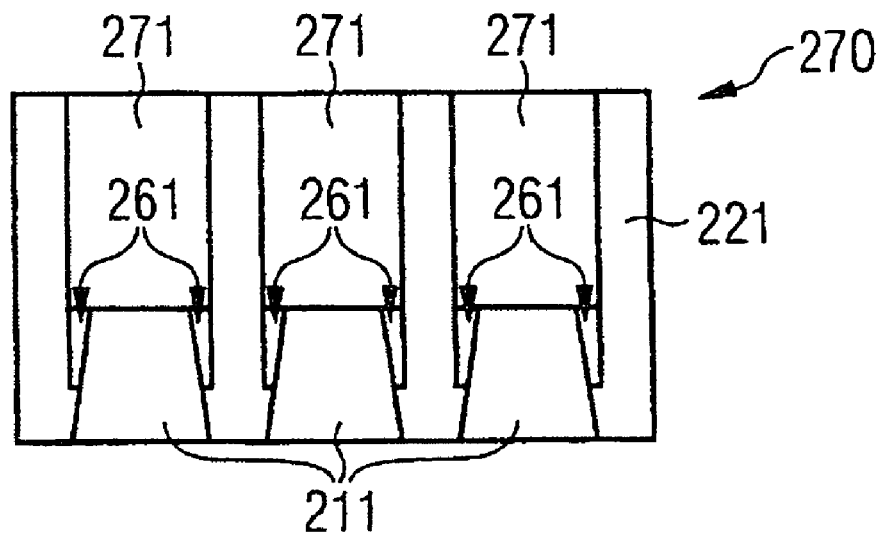
Figure 3G:
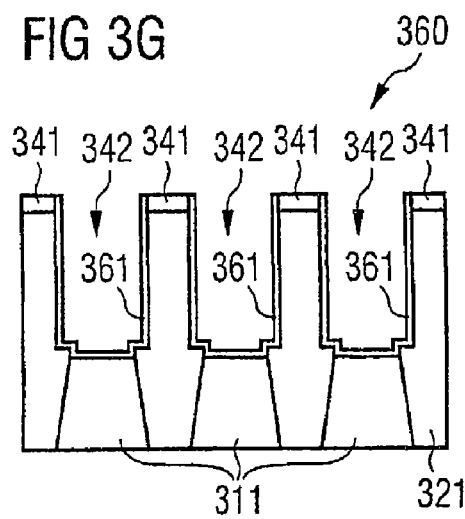

To obtain the layer sequence 360 shown in FIG. 3G, the etching process described with reference to FIG. 3F is continued for a short time, i.e. slight underetching is possibly accepted in order to ensure that really all surface areas of the conductor tracks 311 are completely freed of material previously arranged thereon. As shown in FIG. 3G, no or only extremely slight narrow gaps (as shown with reference number 261 in FIG. 2H) have occurred due to the shortness of this optional overetching process. Furthermore, to obtain the layer sequence 360 shown in FIG. 3G, a liner layer 361 of titanium nitride material with a thickness of approximately 45 nm is formed in each of the trenches 342 by using a deposition process, as a result of which, in particular, the exposed surface areas of the aluminum conductor track 311 are covered with the liner material as barrier layer for coupling the aluminum conductor track 311 to subsequently applied tungsten material of vias.

Figure 3H:
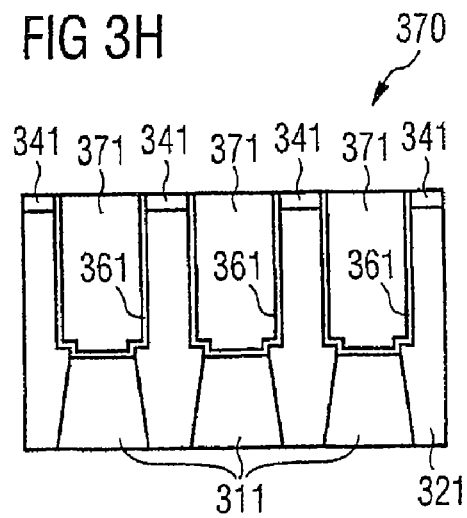

To obtain the layer arrangement 370 shown in FIG. 3H according to a preferred exemplary embodiment of the invention, tungsten material is filled into the trenches 342 as a result of which tungsten vias 371 are formed. The tungsten vias 371 are coupled electrically and mechanically to the aluminum conductor track 311 by means of the liner layer 361. By preventing narrow gaps in boundary areas between lateral sections of the aluminum conductor track 311 and adjoining material of the silicon oxide layer 321, electrical coupling problems between tungsten vias 371 and aluminum conductor tracks 311 have been reliably avoided as a result of which a layer arrangement 370 with high quality and good electrical coupling is made possible.

In the further text, a method for producing a layer arrangement according to a second exemplary embodiment of the invention is described with reference to FIG. 4A to FIG. 4L.

Figure 4A:
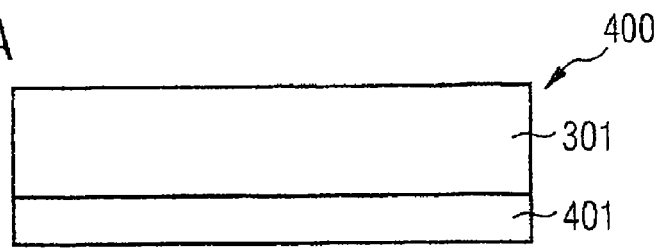

To obtain the layer sequence 400 shown in FIG. 4A, an aluminum layer 301 is formed on a silicon substrate 401.

Figure 4B:
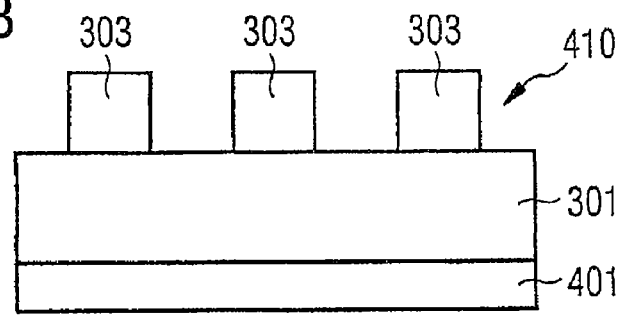

To obtain the layer sequence 410 shown in FIG. 4B, a photoresist mask 303 is applied to the surface of the layer sequence 400.

Figure 4C:
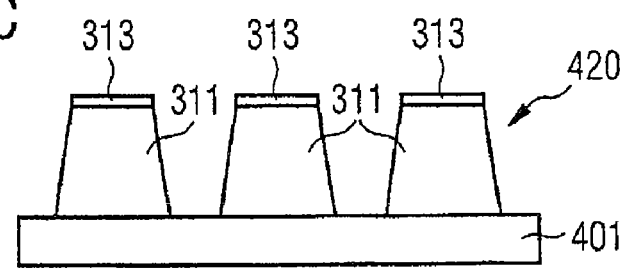

To obtain the layer sequence 420 shown in FIG. 4C, the aluminum layer 301 is patterned by means of the photoresist mask 303 as a result of which aluminum conductor tracks 311 are formed. On the surface of the aluminum conductor tracks 311, photoresist residues 313 can be seen.

Depending on the intended fineness of pattern, a hard-surface mask can be used for patterning the aluminum layer 301. The photoresist 303 is then removed already after the pattern has been transferred into the hard-surface mask. The hard-surface mask then replaces the photoresist mask 303.

Figure 4D:
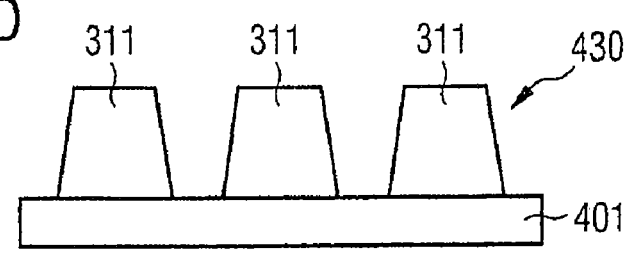

To obtain the layer sequence 430 shown in FIG. 4D, the photoresist residues 313 are removed (e.g. by means of a stripping process or by means of an etching process).

Figure 4E:
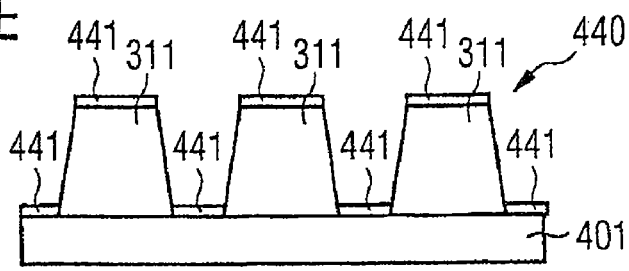

To obtain the layer sequence 440 shown in FIG. 4E, sacrificial layer areas 441 are formed on the layer sequence 430 as a result of which, according to FIG. 4E, horizontal surface areas of the layer sequence 430 are covered with sacrificial layer areas 441. The sacrificial layer areas 441 can also be called adjust liners.

Figure 4F:
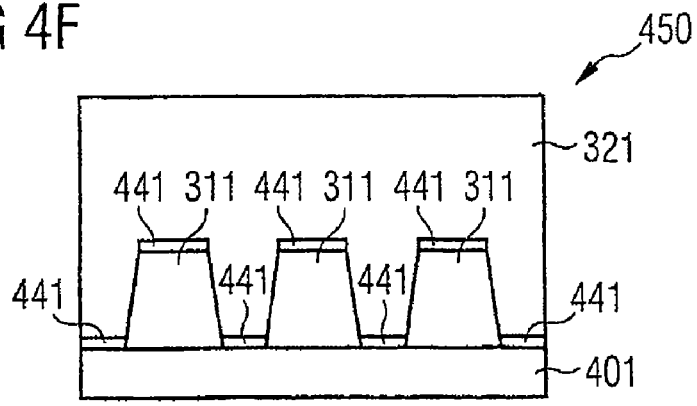

To obtain the layer sequence 450 shown in FIG. 4F, a silicon oxide layer 321 is deposited as interlayer dielectric (ILD).

Figure 4G:
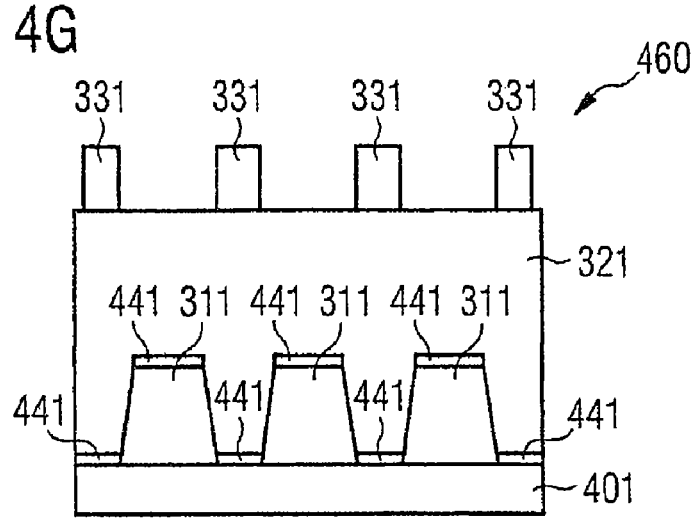

To obtain the layer sequence 460 shown in FIG. 4G, a photoresist mask 331 is formed on the surface of the layer sequence 450.

Figure 4H:
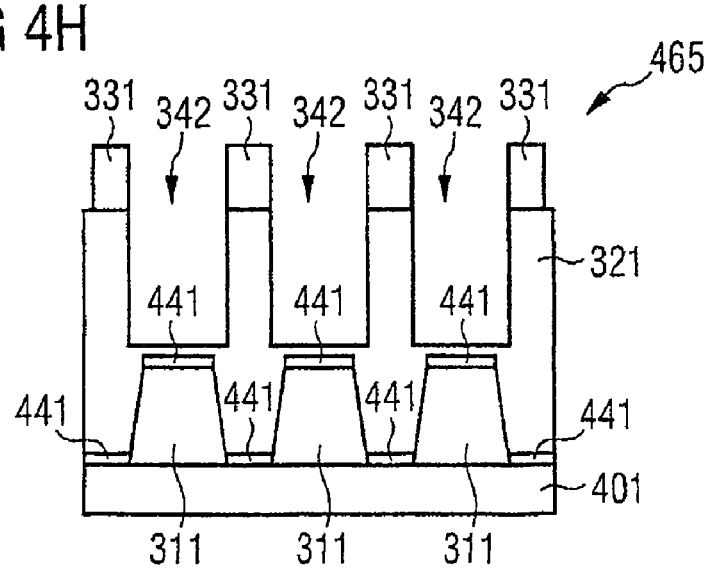

To obtain the layer sequence 465 shown in FIG. 4H, trenches 342 are formed in the silicon oxide layer 321 by etching by using the photoresist mask 331. According to the state of the etching process shown in FIG. 4H, the etch front has not yet reached the surface of the sacrificial layer areas 441.

Figure 4I:
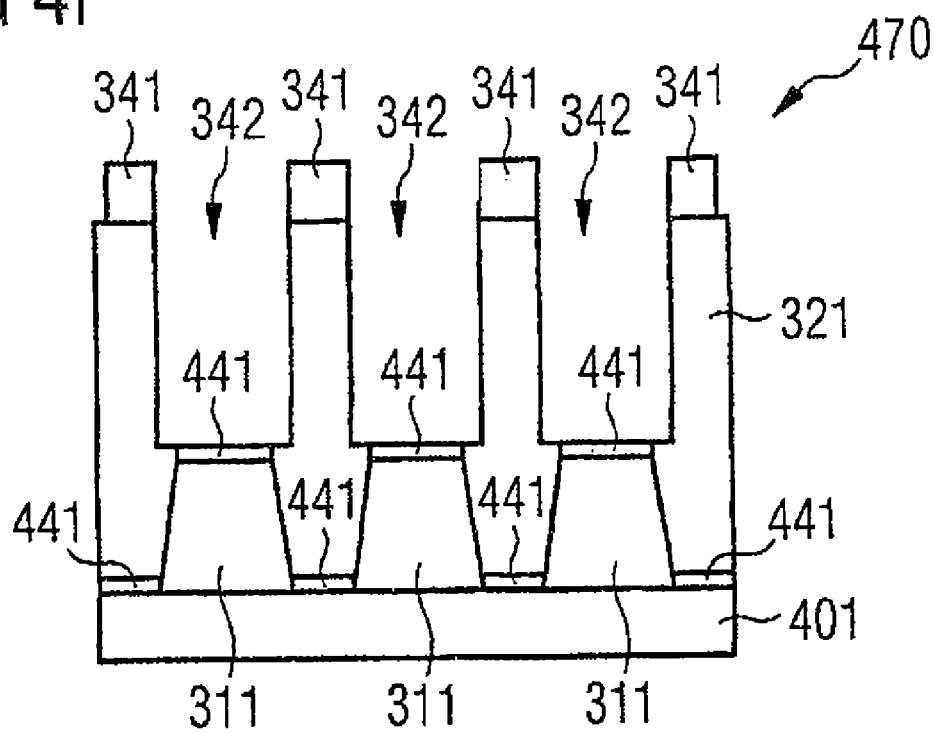

To obtain the layer sequence 470 shown in FIG. 4I, the etching of the silicon oxide layer 321 is continued, wherein, according to FIG. 4I, the etch front has just reached the surface of the sacrificial layer areas 441 on the top end sections of the aluminum conductor track 311.

Figure 4J:
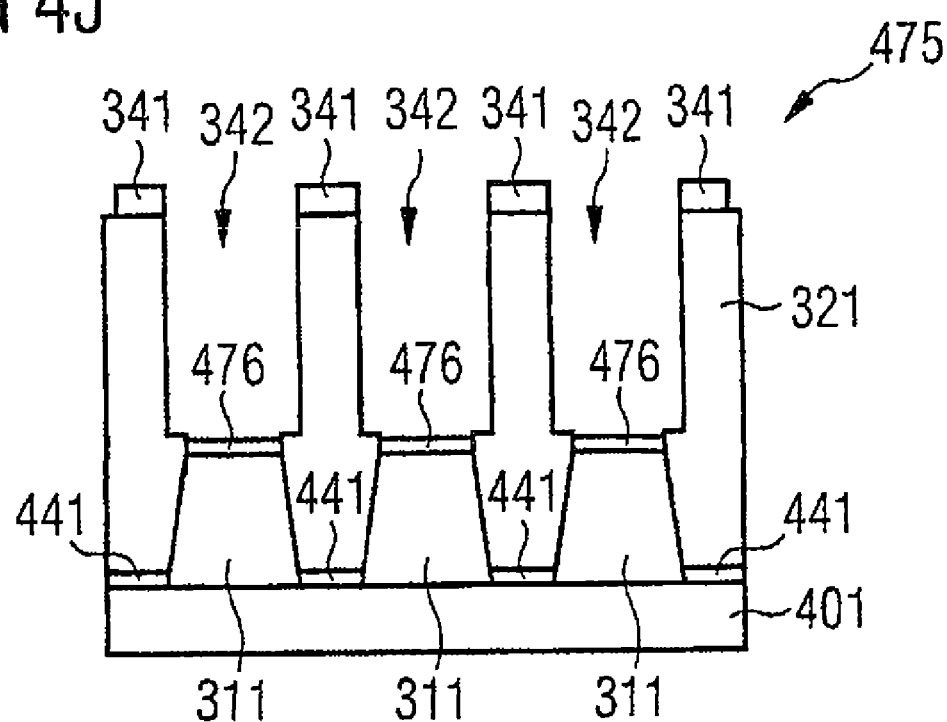

To obtain the layer sequence 475 shown in FIG. 4J, the exposed sacrificial layer areas 441 are subjected to an etching process, the etching parameters being adjusted in such a manner that the exposed sacrificial layer areas 441 are etched much more quickly than the exposed material of the silicon oxide layer 321. This provides the layer sequence 475 shown in FIG. 4J in which, due to the different etching rates for etching the sacrificial layer areas 441, on the one hand, and for etching the silicon oxide layer 321, on the other hand, stepped sections are obtained at transition areas between the material 321 and the sacrificial layer areas 441 to be etched back. Due to the etching of the exposed sacrificial layers 441, sacrificial layer residues 476 are generated.

To obtain the layer sequence 480 shown in FIG. 4K, the etching process for etching the exposed sacrificial layer areas 441 and for etching the sacrificial layer residues 476, respectively, is continued. Due to the different etching rates of the material of the sacrificial layer, on the one hand, and of the silicon oxide layers 321, on the other hand, slightly stepped sections are obtained at edges between the conductor tracks 311 and the silicon oxide layer 321, but not the unwanted narrow gaps as in the prior art.

To obtain the layer sequence 485 shown in FIG. 4L, the trenches 342 are filled with tungsten material which forms tungsten vias 371.

In the further text, detail views of the layer sequences from FIG. 4I to FIG. 4K are again described with reference to FIG. 5A to FIG. 5C in order to explain the prevention of narrow gaps according to the invention again. In the layer sequences 500 to 520 from FIG. 5A to FIG. 5C, a first level 505, a second level 502 and a third level 503 of the etch front for etching the sacrificial layer areas 441 are shown.

The layer sequence 500 shown in FIG. 5A, essentially corresponds to the layer sequence 470 shown in FIG. 4I. In the state shown in FIG. 5A, the etching process has progressed so far that the surface areas of the sacrificial layer areas 441 on the conductor tracks 311 have just been exposed.

If the etching process is continued, the layer sequence 510 shown in FIG. 5B is obtained which essentially corresponds to the layer sequence 475 shown in FIG. 4J. In layer sequence 510, the etch front has progressed to the second level 502 with regard to the sacrificial layer areas 441 so that there are now only sacrificial layer residues 476. Since the etching parameters have been selected in such a manner that the material of the sacrificial layer areas 441 is etched much more rapidly than the material of the silicon oxide layer 321, step-like silicon oxide patterns form at the edge sections of the sacrificial layer residues 476, but not unwanted narrow gaps.

When the etching process is continued further, the layer sequence 520 shown in FIG. 5C is obtained in which the etch front has penetrated to the third level 503. This state essentially corresponds to the layer sequence 480 shown in FIG. 4K. In this state, the surfaces of the conductor tracks 311 are exposed and the material of the sacrificial layers 441 is completely removed from the surfaces of the conductor tracks 311. Material of the sacrificial layers 441 between adjacent conductor tracks remains in the layer sequence 520 and does not have any negative influence on the processing or functionality of the layer sequence 520.

As shown in FIG. 5C, the surface areas of the conductor tracks 311 are reliably exposed due to the etching parameter selected, narrow gaps at the boundary areas between the conductor tracks 311 and the electrically insulating silicon oxide layer 321 being prevented.

In the further text, layer sequences for illustrating the use of the sacrificial layer according to the invention as etch stop layer are described with reference to FIG. 6A, FIG. 6B.

Figure 6A:
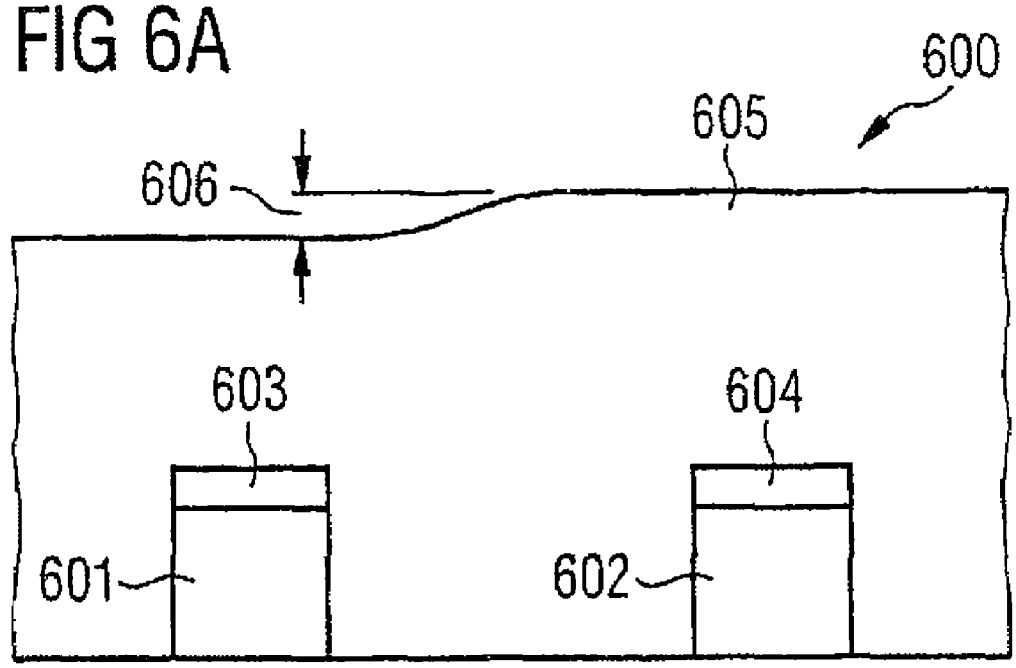
FIGS. 6A, 6B show layer sequences for illustrating the use of the sacrificial layer according to the invention as etch stop layer.

FIG. 6A shows a layer sequence 600 with a first aluminum conductor track 601 and a second aluminum conductor track 602, wherein a first sacrificial layer area 603 is formed on the first aluminum conductor track 601 and a second sacrificial layer area 604 is formed on the second aluminum conductor track 602. Components 601 to 604 are covered by a silicon oxide layer 605, the thickness of which is not completely homogeneous but has a thickness range 606.

Figure 6B:
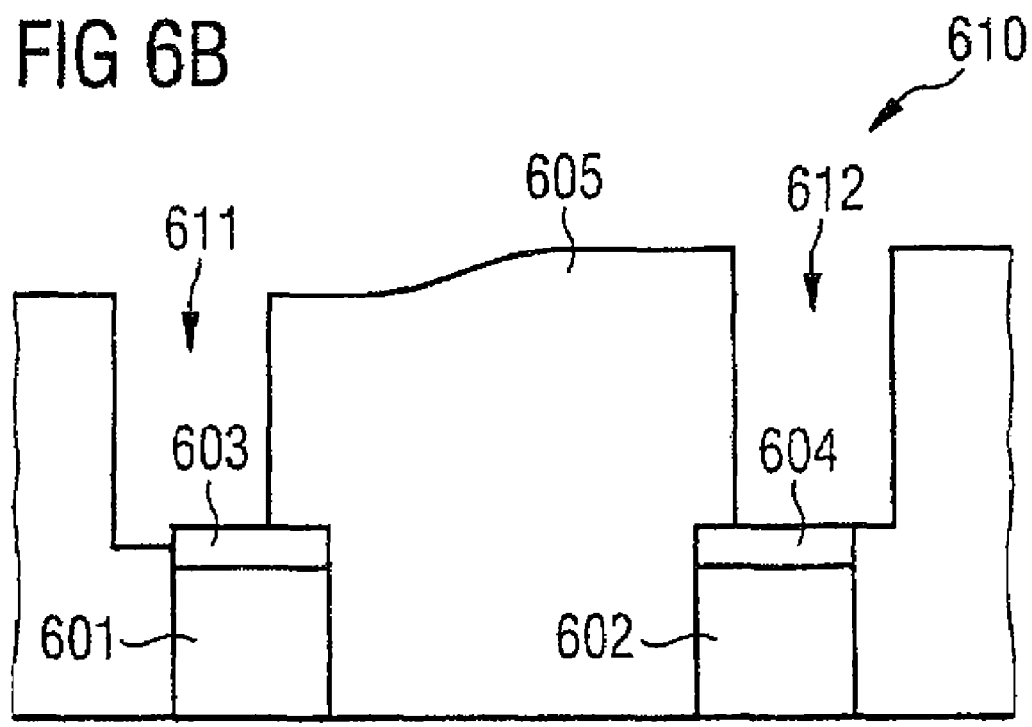

FIG. 6B shows a layer sequence 610 in which a first trench 611 is formed for exposing the first sacrificial layer area 603 and a second trench 612 is formed for exposing the second sacrificial layer area 604 by using an etching process. Due to the thickness range 606 and an unwanted lateral etching mask offset, the etch front has removed, on the side of the first sacrificial layer area 603, material of the silicon oxide layer 605 which is thin in this area, whereas the etch front has not removed, on the side of the second sacrificial layer area 604, any material of the silicon oxide layer 605 which is thick in this area, but has there just reached the surface of the second sacrificial layer area 604.

When the sacrificial layer areas 603, 604 are used as etch stop layer, material of the silicon oxide layer 605 located above the aluminum conductor tracks 601, 602 and above the sacrificial layer areas 603, 604 is thus first removed, the removal of material of the etching process ending when the sacrificial layer areas 603, 604 are reached. In the case of the (unwanted but not always completely avoidable) lateral offset of the etching mask, i.e. since the etch front is slightly offset laterally with respect to the sacrificial layer areas 603, 604, it may happen that material of the silicon oxide layer 605 located adjacently to the sacrificial layer areas 603, 604 is removed which, according to FIG. 6B, is arranged laterally below the surface of the sacrificial layer area 603. In this scenario, it is advantageous if the thickness of the sacrificial layer areas 603, 604 is selected to be at least as large as the thickness range 606 (i.e. one width of thickness variation) of the silicon oxide layer 605 since then no unwanted narrow gap is created with such a lateral offset. This is because, if the etch front reaches the sacrificial layer at the thickest place of the silicon oxide layer 605 (i.e. above the second sacrificial layer area 604), it has not yet completely passed the thinnest place of the silicon oxide layer 605 at the first sacrificial layer area 603.

In the further text, layer sequences for illustrating the use of the sacrificial layer according to the invention as rapidly etchable layer are described with reference to FIG. 7A to FIG. 7C.

Figure 7A:
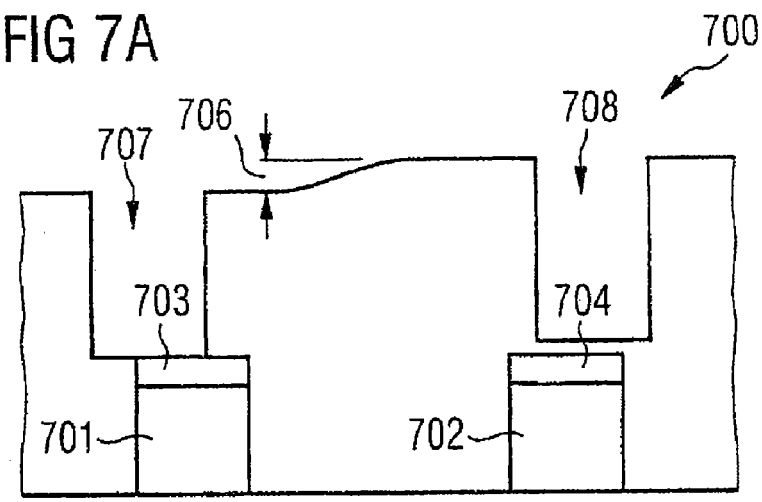
FIGS. 7A to 7C show layer sequences for illustrating the use of the sacrificial layer according to the invention as rapidly etchable layer.

FIG. 7A shows a layer sequence 700 with a first aluminum conductor track 701 and with a second aluminum conductor track 702, wherein a first sacrificial layer area 703 is formed on the first aluminum conductor track 701 and a second sacrificial layer area 704 is formed on the second aluminum conductor track 702. Components 701 to 704 are covered by a silicon oxide layer 705, the thickness of which is not completely homogeneous but has a thickness range 706.

In the layer sequence 700, a first trench 707 is etched for exposing the first sacrificial layer area 703 and a second trench 708 which, due to the thickness range 706 and the great thickness of the silicon oxide layer 705 in this area is not yet deep enough so that the second sacrificial layer area 704 would already be exposed, is etched by using an etching process. In other words, in the layer sequence 700, the etch front has just reached the sacrificial layer at the thinnest place of the silicon oxide layer 705, i.e. at the first sacrificial layer area 703.

Figure 7B:
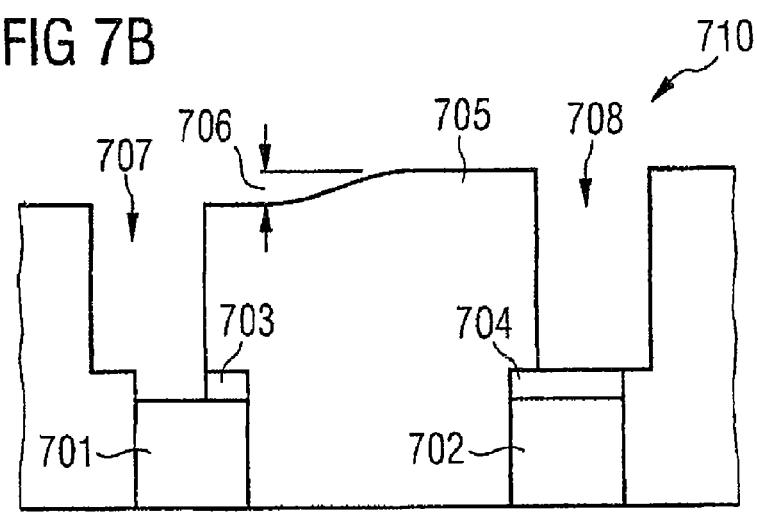

FIG. 7B shows a layer sequence 710 at a later time during the processing. According to FIG. 7B, the etch front has reached the second sacrificial layer area 704. Due to the high etching rate of the material of the sacrificial layer, an exposed section of the first sacrificial layer area 703 has already been completely removed. To the side of this, no interfering narrow gap is created due to the much lower etching rate of the silicon oxide layer 705.

Figure 7C:
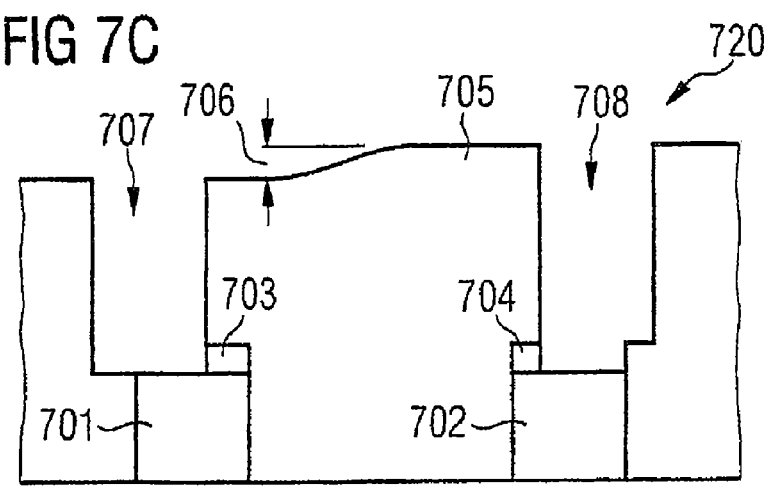

FIG. 7C shows a layer sequence 720 at an even later time during the processing. According to FIG. 7C, the etch front has also removed an exposed section of the second sacrificial layer area 704 close to which area the silicon oxide layer 705 has the greatest thickness. Due to the high etching rate of the material of the sacrificial layer and the much lower etching rate of the silicon oxide layer 705, no interfering narrow gaps are created. This applies, in particular, if the vertical thickness of the sacrificial layer areas 703, 704 is at least as great as the thickness range 706.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

The invention claimed is:

1. A method for manufacturing a layer arrangement, comprising:
   forming an electrically conductive layer on a substrate, the electrically conductive layer comprising an upper end section;
   patterning the electrically conductive layer to form a patterned electrically conductive layer;
   forming a sacrificial layer on a part of the patterned electrically conductive layer, the sacrificial layer having a first thickness;
   forming an electrically insulating layer on the electrically conductive layer and on the sacrificial layer, the electrically insulating layer having a second thickness and a thickness variation range;
   patterning the electrically insulating layer to expose a surface area of the sacrificial layer;
   removing an exposed area of the sacrificial layer to expose the patterned electrically conductive layer; and
   covering the patterned electrically conductive layer with a pattern of electrically conductive material;
   wherein the first thickness is at least as large as the thickness variation range of the electrically insulating layer.

2. The method of claim 1, further comprising using the sacrificial layer as a stop layer.

3. The method of claim 1, where patterning the electrically insulating layer comprises removing the electrically insulating layer until the surface area of the sacrificial layer on the upper end section of the electrically conductive layer is reached.

4. The method of claim 3, where the exposed area of the sacrificial layer and the electrically insulating layer are removed using an etching process.

5. The method of claim 4, further comprising using at least one of tetrafluoromethane, trifluoromethane, nitrogen, and argon as an etchant in the etching process.

6. The method of claim 4, further comprising adjusting a concentration of carbon monoxide in an etchant to adjust an etching rate of the etching process.

7. The method of claim 4, further comprising adjusting a concentration of at least one of oxygen and hydrogen in an etchant to adjust an etching rate of the etching process.

8. The method of claim 1, where the first thickness is less than the second thickness.

9. The method of claim 1, further comprising forming a liner layer between the electrically conductive layer and the pattern of electrically conductive material.

10. The method of claim 9, where the liner layer is formed after removing the exposed area of the sacrificial layer to expose the patterned electrically conductive layer.

11. The method of claim 9, where the liner layer is formed from titanium nitride.

12. The method of claim 1, where patterning the electrically conductive layer comprises using a lithography process and an etching process.

13. The method of claim 1, where forming the sacrificial layer comprises using a conformal deposition process.

14. The method of claim 1, where the layer arrangement comprises an integrated circuit.

15. The method of claim 1, further comprising forming vias filled with a pattern of electrically conductive material, and where patterning the electrically conductive layer comprises forming conductor tracks through patterning the electrically conductive layer.

16. The method of claim 1, where the electrically conductive layer is formed from at least one of aluminum and tungsten.

17. The method of claim 1, where the sacrificial layer is formed from at least one of silicon nitride and silicon oxynitride.

18. The method of claim 1, where the electrically insulating layer is formed from silicon oxide.

19. The method of claim 3, where the exposed area of the sacrificial layer is removed at a higher rate than the electrically insulating layer is removed.

* * * * *